United States Patent
Schuster et al.

(10) Patent No.: US 7,755,839 B2
(45) Date of Patent: *Jul. 13, 2010

(54) MICROLITHOGRAPHY PROJECTION OBJECTIVE WITH CRYSTAL LENS

(75) Inventors: Karl-Heinz Schuster, Konigsbronn (DE); Wilfried Clauss, Tuebingen (DE)

(73) Assignee: Carl Zeiss SMT AG, Oberkochen (DE)

( * ) Notice: Subject to any disclaimer, the term of this patent is extended or adjusted under 35 U.S.C. 154(b) by 432 days.

This patent is subject to a terminal disclaimer.

(21) Appl. No.: 10/596,626

(22) PCT Filed: Dec. 15, 2004

(86) PCT No.: PCT/EP2004/014290

§ 371 (c)(1),
(2), (4) Date: Jun. 19, 2006

(87) PCT Pub. No.: WO2005/059618

PCT Pub. Date: Jun. 30, 2005

(65) Prior Publication Data

US 2007/0091451 A1    Apr. 26, 2007

Related U.S. Application Data

(60) Provisional application No. 60/530,623, filed on Dec. 19, 2003, provisional application No. 60/568,006, filed on May 4, 2004.

(51) Int. Cl.
*G02B 3/00* (2006.01)
*G02B 9/00* (2006.01)
*G03B 27/42* (2006.01)

(52) U.S. Cl. .............. 359/649; 359/650; 359/651; 359/355; 359/356; 359/357; 355/53; 355/67; 355/77; 430/321

(58) Field of Classification Search ......... 359/649–651, 359/355–357; 355/53, 55, 67–71, 77; 430/321
See application file for complete search history.

(56) References Cited

U.S. PATENT DOCUMENTS 2,380,887 A    7/1945    Warmishan (Continued)

FOREIGN PATENT DOCUMENTS

CN    1802726 A    7/2008

(Continued)

OTHER PUBLICATIONS

Roblin, G., Problèmes Posés par la Conception D'un Objectif Photoréducteur Fonctionnant en UV, Journal Of Optics, vol. 15, pp. 281-285 (1984).

(Continued)

*Primary Examiner*—Evelyn A. Lester
(74) *Attorney, Agent, or Firm*—Darby & Darby P.C.

(57) ABSTRACT

Very high aperture microlithography projection objectives operating at the wavelengths of 248 nm, 193 nm and also 157 nm, suitable for optical immersion or near-field operation with aperture values that can exceed 1.4 are made feasible with crystalline lenses and crystalline end plates P of NaCl, KCl, KI, RbI, CsI, and MgO, YAG with refractive indices up to and above 2.0. These crystalline lenses and end plates are placed between the system aperture stop AS and the wafer W, preferably as the last lenses on the image side of the objective.

14 Claims, 7 Drawing Sheets

U.S. PATENT DOCUMENTS

Figure 1:
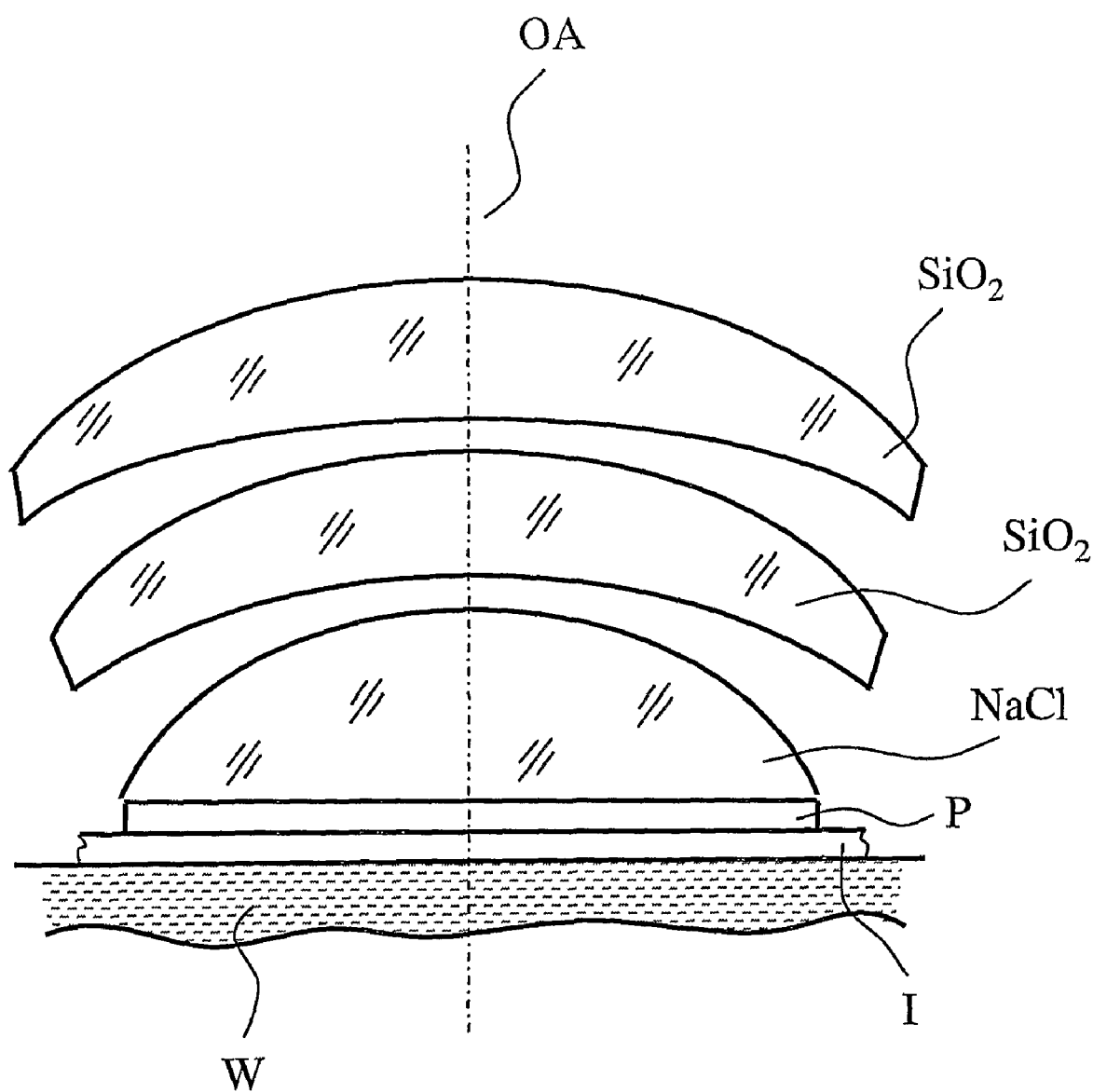

| | | |
|---|---|---|
| 3,244,073 A | 4/1966 | Bouwers et al. |
| 4,103,990 A | 8/1978 | Yamada et al. |
| 4,241,390 A | 12/1980 | Markle et al. |
| 4,293,186 A | 10/1981 | Offner |
| 4,346,164 A | 8/1982 | Tabarelli et al. |
| 4,398,809 A | 8/1983 | Canzek et al. |
| 4,443,068 A | 4/1984 | Itoh et al. |
| 4,469,414 A | 9/1984 | Shafer |
| 4,482,219 A | 11/1984 | Canzek et al. |
| 4,666,259 A | 5/1987 | Iizuka et al. |
| 4,685,777 A | 8/1987 | Hirose et al. |
| 4,711,535 A | 12/1987 | Shafer |
| 4,757,354 A | 7/1988 | Sato et al. |
| 4,779,966 A | 10/1988 | Friedman |
| 4,812,028 A | 3/1989 | Matsumoto et al. |
| 4,834,515 A | 5/1989 | Mercado |
| 4,861,148 A | 8/1989 | Sato et al. |
| 4,951,078 A | 8/1990 | Okada et al. |
| 5,004,331 A | 4/1991 | Haseltine et al. |
| 5,031,976 A | 7/1991 | Shafer |
| 5,063,586 A | 11/1991 | Jewell et al. |
| 5,114,238 A | 5/1992 | Sigler |
| 5,121,256 A | 6/1992 | Corle et al. |
| 5,153,898 A | 10/1992 | Suzuki et al. |
| 5,212,588 A | 5/1993 | Viswanathan et al. |
| 5,220,590 A | 6/1993 | Bruning et al. |
| 5,315,629 A | 5/1994 | Jewell et al. |
| 5,353,322 A | 10/1994 | Bruning et al. |
| 5,410,434 A | 4/1995 | Shafer |
| 5,477,304 A | 12/1995 | Nishi et al. |
| 5,488,229 A | 1/1996 | Elliott et al. |
| 5,515,207 A | 5/1996 | Foo |
| 5,636,066 A | 6/1997 | Takahashi et al. |
| 5,650,877 A | 7/1997 | Phillips, Jr. et al. |
| 5,652,679 A | 7/1997 | Freeman et al. |
| 5,686,728 A | 11/1997 | Shafer |
| 5,717,518 A | 2/1998 | Shafer et al. |
| 5,729,376 A | 3/1998 | Hall et al. |
| 5,734,496 A | 3/1998 | Beach et al. |
| 5,802,335 A | 9/1998 | Sturlesi et al. |
| 5,805,346 A | 9/1998 | Tomimatsu et al. |
| 5,805,365 A | 9/1998 | Sweatt |
| 5,815,310 A | 9/1998 | Williamson et al. |
| 5,861,997 A | 1/1999 | Takahashi |
| 5,917,879 A | 6/1999 | Mashima et al. |
| 5,956,192 A | 9/1999 | Williamson et al. |
| 5,969,441 A | 10/1999 | Loopstra et al. |
| 5,999,310 A | 12/1999 | Shafer et al. |
| 6,025,115 A | 2/2000 | Komatsu et al. |
| 6,033,079 A | 3/2000 | Hudyma |
| 6,064,516 A | 5/2000 | Schuster et al. |
| 6,097,537 A | 8/2000 | Takahashi et al. |
| 6,169,627 B1 | 1/2001 | Schuster et al. |
| 6,169,637 B1 | 1/2001 | Tsunashima et al. |
| 6,172,825 B1 | 1/2001 | Takahashi et al. |
| 6,188,513 B1 | 2/2001 | Hudyma et al. |
| 6,195,213 B1 | 2/2001 | Omura et al. |
| 6,213,610 B1 | 4/2001 | Takahashi et al. |
| 6,259,510 B1 | 7/2001 | Suzuki et al. |
| 6,262,845 B1 | 7/2001 | Sweatt |
| 6,285,737 B1 | 9/2001 | Sweatt et al. |
| 6,353,470 B1 | 3/2002 | Dinger et al. |
| 6,426,506 B1 | 7/2002 | Hudyma |
| 6,473,243 B1 | 10/2002 | Omura et al. |
| 6,597,498 B1 | 7/2003 | Schuster et al. |
| 6,600,608 B1 | 7/2003 | Shafer et al. |
| 6,631,036 B2 | 10/2003 | Schuster et al. |
| 6,636,350 B2 | 10/2003 | Shafer et al. |
| 6,717,722 B2 | 4/2004 | Shafer et al. |
| 6,750,948 B2 | 6/2004 | Omura et al. |
| 6,757,051 B2 | 6/2004 | Takahashi et al. |
| 6,816,320 B2 | 11/2004 | Wada et al. |
| 6,822,727 B2 | 11/2004 | Shima et al. |
| 6,829,099 B2 | 12/2004 | Kato et al. |
| 6,842,298 B1 | 1/2005 | Shafer et al. |
| 6,873,476 B2 | 3/2005 | Shafer |
| 6,912,042 B2 | 6/2005 | Shafer |
| 8,930,758 | 8/2005 | Schuster et al. |
| 6,995,886 B2 | 2/2006 | Hendriks et al. |
| 6,995,918 B2 | 2/2006 | Terasawa et al. |
| 6,995,930 B2 | 2/2006 | Shafer et al. |
| 7,030,965 B2 | 4/2006 | Takahashi et al. |
| 7,075,726 B2 | 7/2006 | Terasawa et al. |
| 7,079,314 B1 | 7/2006 | Suenaga et al. |
| 7,085,075 B2 | 8/2006 | Mann et al. |
| 7,092,168 B2 | 8/2006 | Terasawa et al. |
| 7,187,503 B2 | 3/2007 | Rostalski et al. |
| 7,190,530 B2 | 3/2007 | Mann et al. |
| 7,218,445 B2 | 5/2007 | Shafer et al. |
| 7,224,520 B2 | 5/2007 | Mitchell |
| 7,237,915 B2 | 7/2007 | Hudyma |
| 7,239,453 B2 | 7/2007 | Terasawa et al. |
| 7,466,489 B2 * | 12/2008 | Beder et al. .................. 359/649 |
| 2001/0019454 A1 | 9/2001 | Tadic-Galeb et al. |
| 2002/0024741 A1 | 2/2002 | Terasawa et al. |
| 2002/0102497 A1 | 8/2002 | Sparrow |
| 2002/0176063 A1 | 11/2002 | Omura |
| 2003/0011755 A1 | 1/2003 | Omura et al. |
| 2003/0011894 A1 | 1/2003 | Schuster |
| 2003/0174301 A1 | 9/2003 | Imanishi |
| 2003/0174408 A1 | 9/2003 | Rostalski et al. |
| 2003/0197922 A1 | 10/2003 | Hudyma |
| 2003/0197946 A1 | 10/2003 | Omura |
| 2003/0234912 A1 | 12/2003 | Omura |
| 2003/0234992 A1 | 12/2003 | Shafer |
| 2004/0012866 A1 | 1/2004 | Mann et al. |
| 2004/0075895 A1 | 4/2004 | Lin |
| 2004/0130806 A1 | 7/2004 | Takahashi |
| 2004/0160677 A1 | 8/2004 | Epple et al. |
| 2004/0190151 A1 | 9/2004 | Krahmer et al. |
| 2004/0207928 A1 | 10/2004 | Schultz et al. |
| 2004/0240047 A1 | 12/2004 | Shafer et al. |
| 2005/0036213 A1 | 2/2005 | Mann et al. |
| 2005/0082905 A1 | 4/2005 | Gronau et al. |
| 2005/0179994 A1 | 8/2005 | Webb |
| 2005/0190435 A1 | 9/2005 | Shafer et al. |
| 2005/0190455 A1 | 9/2005 | Rostalski et al. |
| 2005/0225737 A1 | 10/2005 | Weissenrieder et al. |
| 2005/0248856 A1 | 11/2005 | Omura et al. |
| 2006/0012885 A1 | 1/2006 | Beder et al. |
| 2006/0066962 A1 | 3/2006 | Totzeck et al. |
| 2006/0077366 A1 | 4/2006 | Shafer et al. |
| 2006/0114445 A1 | 6/2006 | Ebihara |
| 2006/0119750 A1 | 6/2006 | Epple et al. |
| 2006/0132739 A1 | 6/2006 | Ebihara |
| 2006/0132740 A1 | 6/2006 | Ebihara |
| 2006/0198018 A1 | 9/2006 | Shafer et al. |
| 2006/0221456 A1 | 10/2006 | Shafer et al. |
| 2006/0244938 A1 | 11/2006 | Schuster |
| 2006/0256447 A1 | 11/2006 | Dodoc |
| 2007/0037079 A1 | 2/2007 | Omura |
| 2007/0064214 A1 | 3/2007 | Ebihara |
| 2007/0091451 A1 | 4/2007 | Schuster |
| 2007/0109659 A1 | 5/2007 | Rostalski et al. |
| 2007/0165198 A1 | 7/2007 | Kneer et al. |
| 2007/0211234 A1 | 9/2007 | Ebihara |
| 2008/0037111 A1 | 2/2008 | Shafer et al. |

FOREIGN PATENT DOCUMENTS

| | | |
|---|---|---|
| DE | 19633128 A1 | 2/1998 |
| DE | 10123725 A1 | 11/2002 |
| DE | 10 2004/051730.4 | 10/2004 |
| DE | 10332112 A1 | 1/2005 |

| | | | |
|---|---|---|---|
| DE | 10200505672 A1 | 11/2006 | |
| EP | 0267766 A2 | 5/1988 | |
| EP | 0 475 020 A | 3/1992 | |
| EP | 0951054 A1 | 10/1999 | |
| EP | 0962830 | 12/1999 | |
| EP | 1059550 A1 | 12/2000 | |
| EP | 1061396 A2 | 12/2000 | |
| EP | 1069448 | 1/2001 | |
| EP | 1089327 A1 | 4/2001 | |
| EP | 1098215 A1 | 5/2001 | |
| EP | 1318425 A2 | 6/2003 | |
| EP | 1336887 A1 | 8/2003 | |
| EP | 1480065 A2 | 11/2004 | |
| EP | 1635382 A1 | 3/2006 | |
| GB | 2146454 A | 4/1985 | |
| JP | 5175098 A | 7/1993 | |
| JP | 06053120 A | 2/1994 | |
| JP | 6188169 A | 7/1994 | |
| JP | 8166542 A | 6/1996 | |
| JP | 8330220 A | 12/1996 | |
| JP | 9148241 A | 6/1997 | |
| JP | 10183099 A | 6/1998 | |
| JP | 10214783 A | 8/1998 | |
| JP | 10284408 A | 10/1998 | |
| JP | 10303114 A | 11/1998 | |
| JP | 2001228401 A | 8/2001 | |
| JP | 2002208551 A | 7/2002 | |
| JP | 2002372668 A | 12/2002 | |
| JP | 2003114387 | 4/2003 | |
| JP | 2003307680 A | 10/2003 | |
| JP | 2004317534 A | 11/2004 | |
| JP | 2004333761 A | 11/2004 | |
| JP | 2005003982 A | 1/2005 | |
| KR | 102006018869 | 3/2006 | |
| WO | WO-9205462 A2 | 4/1992 | |
| WO | WO-9406047 | 3/1994 | |
| WO | WO-9828665 A1 | 7/1998 | |
| WO | WO-9926097 A1 | 5/1999 | |
| WO | WO-9942905 A1 | 8/1999 | |
| WO | WO-9957596 A1 | 11/1999 | |
| WO | WO-0104682 A1 | 1/2001 | |
| WO | WO-0151979 A2 | 7/2001 | |
| WO | WO-0155767 A2 | 8/2001 | |
| WO | WO-0159502 A2 | 8/2001 | |
| WO | WO-02091078 A1 | 11/2002 | |
| WO | WO-03036361 A1 | 5/2003 | |
| WO | WO-03077007 A2 | 9/2003 | |
| WO | WO-03077036 A1 | 9/2003 | |
| WO | WO-03088330 A1 | 10/2003 | |
| WO | WO-2004010200 A1 | 1/2004 | |
| WO | WO-2004/019128 | 3/2004 | |
| WO | WO-2004019128 A2 | 3/2004 | |
| WO | WO-2004107011 A1 | 12/2004 | |
| WO | WO-2004114380 A1 | 12/2004 | |
| WO | WO-2005001432 A2 | 1/2005 | |
| WO | WO-2005013009 A1 | 2/2005 | |
| WO | WO-2005015316 A2 | 2/2005 | |
| WO | WO-2005040890 A2 | 5/2005 | |
| WO | WO-2005/059654 | 6/2005 | |
| WO | WO-2005059055 A2 | 6/2005 | |
| WO | WO-2005059654 A1 | 6/2005 | |
| WO | WO-2005/081067 | 9/2005 | |
| WO | WO-2005098504 A1 | 10/2005 | |
| WO | WO-2005098505 A1 | 10/2005 | |
| WO | WO-2005098506 A1 | 10/2005 | |
| WO | WO-2005/106589 | 11/2005 | |
| WO | WO-2005111689 A2 | 11/2005 | |
| WO | WO-2006005547 A1 | 1/2006 | |
| WO | WO-2007025643 A1 | 3/2007 | |
| WO | WO-2007086220 A1 | 8/2007 | |

OTHER PUBLICATIONS

Smith, B. W. et al., "Water Immersion Optical Lithography for the 45nm Node", *Optical Microlithography XVI, Proceedings of SPIE* (2003) vol. 5040; 679-689.

Smith, B.W. et al., "Approaching the numerical aperture of water-Immersion lithography at 193nm", *Optical Microlithography XVII, Proceedings of SPIE*, vol. 5377; 273-284, 2004.

Burnett, J.H. et al., "High Index Materials for 193 nm and 157 nm Immersion Lithography", International Symposium on Immersion & 157 nm Lithography, Vancouver, Aug. 2, 2004.

English Language Machine Translation of DE 102004059778 which claims priority to unpublished DE 10 2004 051 730.4, Aug. 4, 2005.

U.S. Appl. No. 60/632,530, filed Dec. 1, 2004, Weippert et al.

M. Switkes et al., Resolution Enhancement of 157-nm Lithography by Liquid Immersion, Proc. SPIE vol. 4691, Optical Microlithography XV, pp., 459-465, Jul. 2002.

Tomoyuki Matsuyama et al., "Microlithographic Lens for DUV Scanner," SPIE vol. 4832, Dec. 2003, pp. 170-174.

Tomoyuki, Matsuyama et al, "High NA and Low Residual Aberration Projection Lens for DUV Scanner," SPIE, vol. 4691 (2002), pp. 687-695.

Ulrich, W. et al., "Trends in Optical Design of Projection Lenses for UV-and EUV-Lithography," Proc. Of SPIE vol. 4146 (2000).

Glalzet E., "New Lenses for Microkithography ," SPIE vol. 237 (1980), pp. 310-320.

J. J Shaffer et al., "Effect of Thermal Cycling on Dimensional Stability of Zerodur and ULE", Applied Optics, vol. 23, No. 14. Sep. 1, 1994.

Jacobs et al., "Expansion hysteresis upon thermal cycling of Zerodur", Applied Optics, vol, 23. No. 17, Sep. 1, 1984.

Lindig et al., "Thermal expansion and length stability of Zerodur in dependense on temperature and time", Applied Optics, vol. 24, No. 20, Oct. 15, 1985.

M. H. Freeman, "Innovative Wide-Field Binocular Design". OSA Proceedings of the International Optical Design Conference, 1994, pp. 369-393, vol. 22.

Tomoyuki Matsuyama et al., "Nikon Projection Lens Update", Proceedings of SPIE, 2004, vol. 5377, No. 65.

Donald DeJager, "Camera viewfinder using tilted concave mirror erecting elements", International Lens Design Conference (OSA), SPIE, 1980, pp. 292-298, vol. 237.

* cited by examiner

MICROLITHOGRAPHY PROJECTION OBJECTIVE WITH CRYSTAL LENS

CLAIM OF PRIORITY

This application is a national phase application under 35 U.S.C. §371 and claims the benefit of priority of International Application No. PCT/EP04/14290, filed Dec. 15, 2004. The application also claims the benefit of priority of U.S. Provisional Application Nos. 60/530,623, filed Dec. 19, 2003, and 60/568,006, filed May 4, 2004.

The invention relates to a microlithography projection objective with at least one crystal lens, wherein the objective is designed in particular for a high numerical aperture and with immersion or optical near field.

From publications such as

Bruce W. Smith et al. Optical Microlithography XVII Proc. SPIE 5377 (2004), p 273-284;

Bruce W. Smith et al. Optical Microlithography XVI, Proc. SPIE 5040 (2003), p 679-689;

John H. Burnett et al. "High Index Materials for 193 nm and 157 nm Immersion lithography" Int'l Symp. on Immersion & 157 nm Lithography, Vancouver Aug. 2, 2004 (NIST/Corning Tropel)

and patent applications such as

WO2004/019 128 A2, or, commonly owned with this application:

U.S. Pat. No. 6,717,722 B,

U.S. Ser. No. 10/734,623 filed 15 Dec. 2003, now U.S. Pat. No. 6,995,930, issued Feb. 7, 2006, U.S. Ser. No. 60/530,623 filed 19 Dec. 2003, U.S. Ser. No. 60/530,978 filed 22 Dec. 2003, U.S. Ser. No. 60/544,967 filed 13 Feb. 2004, U.S. Ser. No. 60/568,006 filed 4 May 2004, U.S. Ser. No. 60/592,208 filed 29 Jul. 2004, U.S. Ser. No. 60/591,775 filed 27 Jul. 2004, U.S. Ser. No. 60/612,823 filed 24 Sep. 2004, DE 10 2004 051 730.4 filed 22 Oct. 2004 some information about this art can be gathered.

Of these, e.g. WO 2004/019 128 A2, U.S. Ser. No. 10/734, 623, now U.S. Pat. No. 6,995,930, issued Feb. 7, 2006, U.S. 60/592,208, U.S. 60/591,775 and U.S. 60/612,823 show objective designs which can be optimized by and combined with the use of materials and teachings according to this application.

Suitable immersion liquids are inter alia described in U.S. 60/568,006 or DE 10 2004 051 730.4.

PCT application entitled "Microlithography Projection Objective with Crystal Elements", inventor Karl-Heinz Schuster, International Application No. PCT/EP2004/014100, filed on Dec. 10, 2004, published as WO/2005/059645 on Jun. 30, 2005, internal reference 04213 P PCT, assigned to the same assignee teaches the case of certain non-cubic crystals in this context. Each can be combined with this invention.

All cited documents are incorporated into this application by reference in their entirety.

Their citation in no way constitutes any declaration on their relevance for this application, and the list certainly is incomplete and many more publications relate to this art.

Crystal lenses consisting in particular of calcium fluoride (fluorspar) or other fluorides have been used until now as a means to achieve a sufficient transmittance at wavelengths below 200 nm and down to, e.g., 126 nm, and also to achieve a chromatic compensation by using fluoride lenses particularly in combination with lens elements of quartz glass. As a rule, these arrangements involved the use of several crystal lenses in the objective, with diameters exceeding 10 cm and with a combined thickness of the order of 10 cm, where the lenses had to be arranged at different places in the objective, including in particular locations close to the pupil and close to the object. Because of the resulting requirements regarding the homogeneity of the mono-crystals only lenses of calcium fluoride were realized in actual practice.

The same material is also known to be suitable for lenses close to a field plane because of its higher radiation resistance associated with a lower degree of compaction compared to quartz glass.

To reduce the achievable structure widths in lithography systems, the first approach that always comes to mind is to use shorter wavelengths. However, the shorter the wavelength, the more difficult it becomes to find suitable immersion materials and lens materials with a high refractive index. Attempts have therefore been made to stay with longer wavelengths but find materials that have an even higher refractive index to compensate for the disadvantage of the longer wavelength. For example, in order to obtain the same level of resolution with light of 248 nm as with light of 193 nm, the aperture has to be larger by a factor of 1.285. According to the formula $NA=k_1\lambda/(structure\ width)$, i.e., $NA=0.3\times248.338\ nm/50\ nm$, a resolution of 50 nm would require a refractive index of at least 1.49 if a value of 0.3 has been selected for $k_1$.

Since quartz glass (fused silica, $SiO_2$) has a refractive index of 1.506235 at a wavelength of 248 nm, a resolution of 50 nm for $k_1=0.285$ could be achieved with the available standard material $SiO_2$. However, the next node at 45 nm is not attainable without a change of material.

Consequently, it is an object of the invention to propose lens materials with a particularly high refractive index for lenses in the area near the image plane of an objective of the kind described in generic terms in the introductory paragraph, including suitable protector plates or other elements. If the refractive index is higher than for quartz glass, it is also possible to use materials whose other properties are less ideal, such as calcium fluoride, for individual elements with a thickness of a few millimeters to centimeters.

Solutions to the foregoing task are proposed in accordance with the independent claims, with advantageous further developed embodiments being proposed in accordance with the subordinate claims and in accordance with the description in its entirety.

In accordance with the invention, a material has been found which has a higher refractive index and can meet all other requirements for lithography applications. As a prerequisite, the material needs to be sufficiently isotropic. However, an intrinsic birefringence in the deep ultraviolet range near the absorption edge has to be tolerated. As a rule, the further away the absorption edge, the smaller are the values of the intrinsic birefringence. A particularly advantageous selection is achieved if the intrinsic birefringence crosses the zero level at the wavelength being used for the lithography application.

For the 45 nm node and a wavelength of 248.338 nm, sodium chloride (NaCl) was found to be suitable, which at this wavelength has a refractive index of 1.657766. Its intrinsic birefringence is small enough that no compensation is necessary. As it is sufficient to make the last optical element or individual ones among the last elements in the objective from this material, all of the other elements can be of quartz glass, which is preferred. However, one could also use, e.g., calcium fluoride.

The invention will be further explained hereinafter with reference to the drawings, wherein FIGS. 1 to 8 schematically illustrate sections through the lenses near the image plane of a projection objective according to the invention, including the immersion area and the wafer or another object being exposed to the projection.

The following symbols are used consistently in the drawings:

AS=aperture stop/system aperture

P=protector plate/protective element

I=immersion

W=wafer, or the object to be exposed in the image plane

FL=fluid configured as a fluid lens

OA=optical axis

FIG. 1 schematically illustrates the last lenses on the image side of a microlithography projection objective according to the invention with an immersion fluid I, for example 25% $D_3PO_4$ in $D_2O$ (n248≈1.66), a monocrystalline last lens of NaCl, with a plane-parallel thin protector plate P or a protective layer placed in between.

For values of $k_1$=0.285, $\lambda$=248.338 nm and a maximum incidence angle of 71.8° from the normal direction, one finds a minimum refractive index of 1.6556, a condition that is met by sodium chloride with a refractive index of 1.657766. Monocrystalline NaCl is not hygroscopic in air, in contrast to commercially available kitchen salt which contains impurities of MgCl and therefore attracts water. It should be clear that the work operations on NaCl in the production process have to be free of water, because NaCl dissolves in liquid water. However, the appropriate working techniques have been known for decades. Otherwise, the lenses can be coated with vapor-deposited layers and worked on with ion beams. Inside the objective, which is normally flushed with helium or nitrogen, moisture is in any event of no concern.

To achieve the 32 nm node at 248 nm requires a large step in the refractive index. One finds that the refractive index needs to come up to slightly more than 2.0. At the same time, it is still necessary to obtain a satisfactory transmittance. According to the invention, the material proposed to meet these requirements is potassium iodide KI with a refractive index of n=2.0523 at 248.338 nm.

Similar to NaCl, potassium iodide is water-soluble but advantageously isotropic. Other representatives of the alkali group in the form of iodides are likewise suitable, including NaI, RbI, CsI.

Since the primary use of iodides is in the infrared range, no raw materials of extreme purity have so far been used to grow crystals for the far ultraviolet range. The transmittance edge for CsI, a material of the highest refractive index, is reported as 227 nm, so that the transmittance values obtained for NaI, Ki, RbI tend to be even more favorable.

The highest index of refraction is obtained with CsI as it has the highest atomic weight in the alkali group. Already at the present time monocrystalline CsI is grown and commercially distributed for infrared applications. As a special precaution, it needs to be noted that the relative humidity of the ambient air around this crystal may not exceed 35%.

Figure 2:
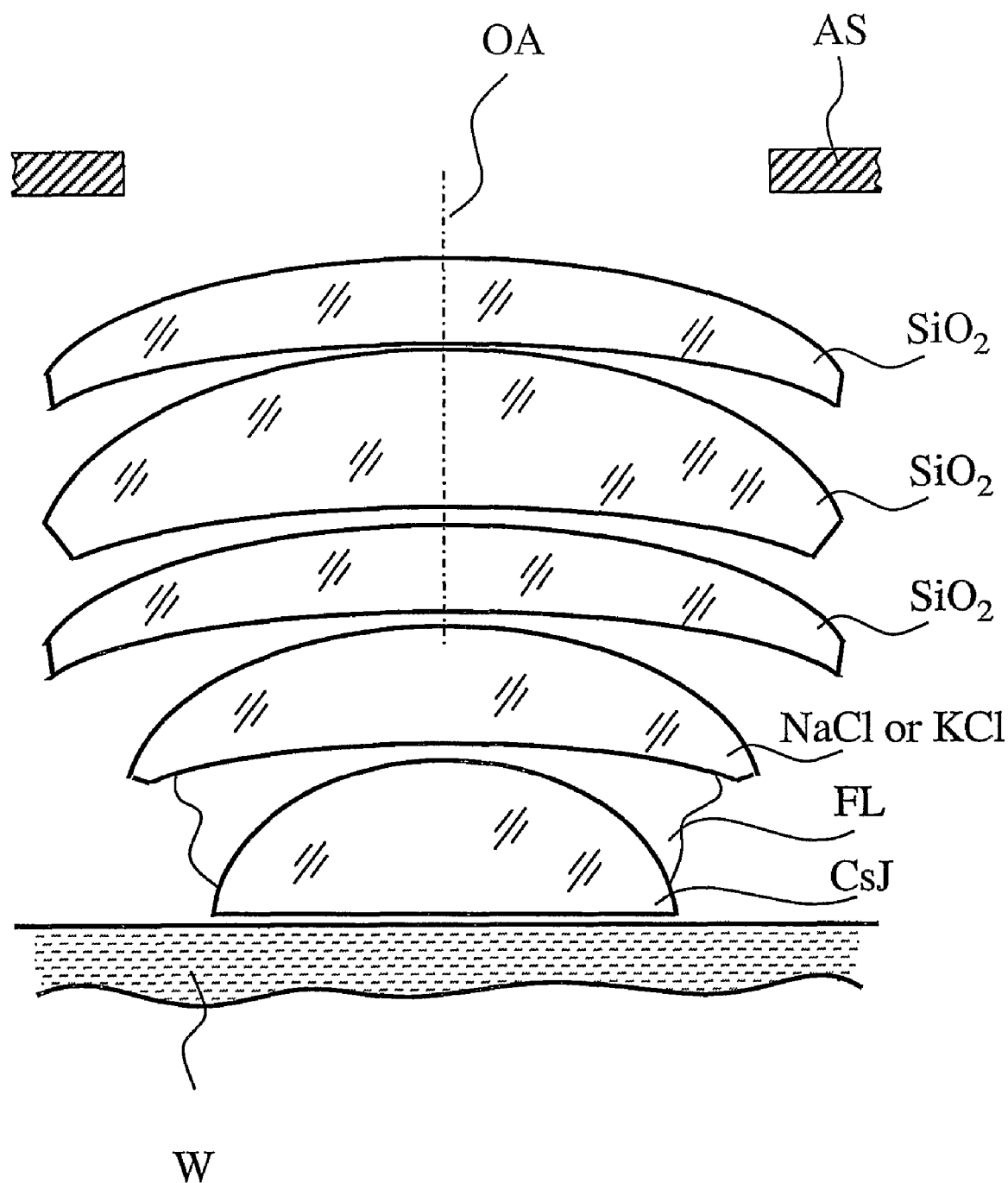

FIG. 2 shows the end portion of a refractive or catadioptric objective with an aperture of more than 2.0. The wafer W is for example in the optical near field, with a distance of 20 nm. To show an example of a fluid lens FL, a fluid from the group of highly refractive substances that are also known as immersion fluids is arranged between the last two lenses on the image side of the objective.

As the iodides of the alkali group are very soft and therefore mechanically delicate, it is recommended to use appropriate protective measures. Proposed is a protector plate of MgO, which has an extremely high refractive index.

For applications at 248 nm and other wavelengths, magnesium oxide MgO has to be produced in crystalline form with the requisite purity. In the form of a thin element, it is sufficiently transparent. The crystalline oxide material is isotropic and has a coefficient of linear thermal expansion of $14\times10^{-6}$/K, while CsI for example has a linear expansion coefficient of $54.9\times10^{-6}$/K. In order to safely join these materials by wringing, it is necessary to overlay the iodide with an adhesive layer of a highly refractive material, for example hafnium oxide over CsI.

Instead of making the lenses of alkali iodide and protecting them with MgO plates, it is of course also possible to use MgO itself for the one or more last elements if a crystal material of suitable transmittance and homogeneity is used. Given that MgO has very good chemical and mechanical properties and is a most highly refractive material with a refractive index over 2.0, it is suitable for the wavelength of 248 nm, if the crystal quality is appropriately optimized.

Instructive comments on this may be found in the paper by John H. Burnett et al. "High Index Materials for 193 nm and 157 nm Immersion Lithography", Intl. Symp. On Immersion+157 nm Lithography, Vancouver, 2 Aug. 2004.

Figure 3:
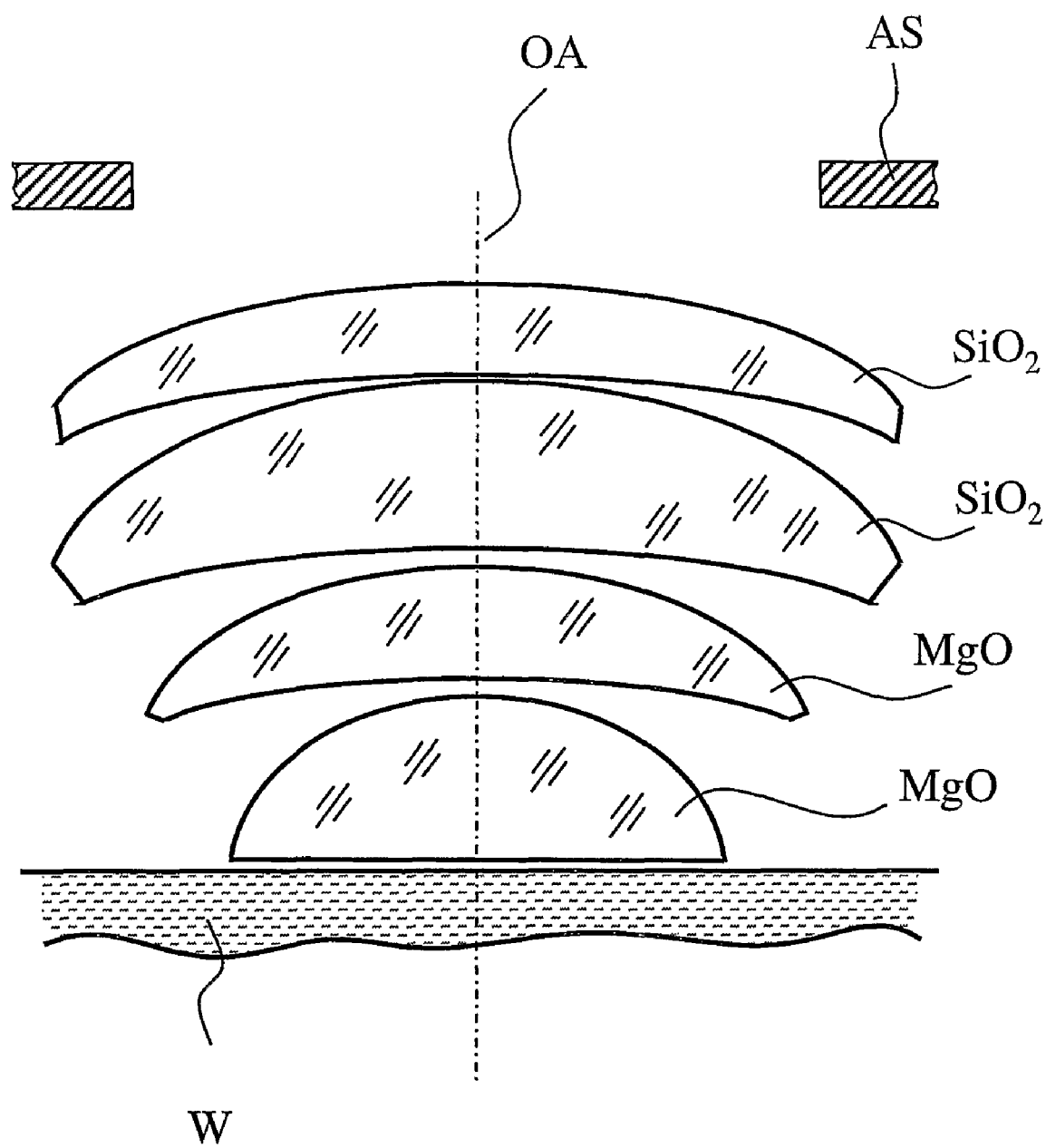

FIG. 3 represents an example of a refractive or catadioptric projection objective in which the system aperture stop or the conjugate plane of the system aperture stop that is closest to the image plane is followed by a lens group in which the last lens and in this case also the next to last lens on the image side of the objective are lenses of monocrystalline magnesium oxide.

Within the context of the periodic system of elements, MgO has a unique position.

The oxides of the first group, i.e., of the alkali group, are very unstable chemically and therefore not usable. Among the oxides of the second group, the alkaline earth group, the oxide of the lightest element is BeO. While the latter has a good transmittance, it has a wurzite structure and is therefore birefringent. The further oxides MgO, CaO, SrO, BaO have the crystal structure of NaCl and are optically isotropic.

However, the transmittance of CaO, SrO, BaO at 248 nm is inadequate. The lightest element of the third group, boron, forms the compound $B_2O_3$, which is strongly hygroscopic and, by absorbing water, disintegrates into boric acid. The next heavier element, aluminum, forms sapphire crystals which are strongly birefringent. Gallium trioxide ($Ga_2O_3$) in both of its modifications (corundum type/monoclinic) is birefringent. Indium trioxide $In_2O_3$ lacks transmittance already for 248 nm and is likewise birefringent.

Magnesium oxide has the further advantage of an excellent chemical stability in contact with many immersion fluids I, which necessarily should likewise have a very high index of refraction at 248 nm. With a system that works in the optical near field, it is important to pay attention to the need for frequent cleaning. Using MgO in the last optical element of the system is advantageous also because of its exceptional hardness and ease of cleaning.

With no immediate need to push up the refractive index at the 45 nm node, it also makes sense to protect an NaCl lens with a thin MgO plate.

It is clear that objectives with aperture values of this magnitude have to be designed with extreme asphericities. It is proposed that the high-refractive elements presented above be likewise designed with aspheric surface curvatures.

In order to prevent the MgO element from heating up, it is important that the MgO crystal be produced from base material components of the highest purity. A certain amount of absorption can be tolerated as long as MgO serves only as a protector plate that is overlaid on another optical material, because with a small thickness of for example 1.0 mm, the absorption volume, and consequently the heat generation, will remain small. If entire lenses are made of MgO, one should aim for a crystal of high purity.

The 193 nm wavelength, while not yet representing the majority of applications, is an established working wavelength and therefore, as a natural consequence, attractive for a further reduction of the structure widths through the use of very large NA values.

The highest refractive indices presently used in the end-positioned elements which consist of $CaF_2$ or $SiO_2$ are:

n=1.501436 for $CaF_2$ at 193.304 nm n=1.560289 for $SiO_2$ at 193.304 nm

Chromatic compensation materials with a higher refractive index and a higher dispersion than $CaF_2$ are known, e.g., from U.S. Pat. No. 6,683,729 B1 (inventor Schuster) and from the aforementioned paper by Burnett et al., including among others the following:

$SrF_2$ for 193.304 nm n=1.510219

$BaF_2$ for 193.304 nm n=1.567043

Thus, an objective with a large refractive lens element of $BaF_2$ in the end position stands up better to radiation than amorphous $SiO_2$, but the refractive index is not significantly increased in comparison to $SiO_2$.

In order to safely reach the 32 nm node with the 193 nm wavelength, one needs a sufficiently high refractive index of the last lens element. For example with $k_1$=0.265 a refractive index of 1.658 is needed, or with $k_1$=0.285 a refractive index of 1.812. The photoresists for 193 already reach values as high as n=1.75 in the best case.

A material has now been found which at 193 nm is sufficiently homogeneous and isotropic in the sense of the cubic crystal structure: Potassium chloride KCl has a very good transmittance at 193 nm and more than satisfies the requirement of a refractive index of 1.685. In fact, the refractive index of KCl is 1.756255 at 193 nm. Given that the resists already reach indices up to 1.75, there is a possible application for a system where the light passes from the last lens to the resist on a wafer by means of the optical near field without immersion.

Figure 4:
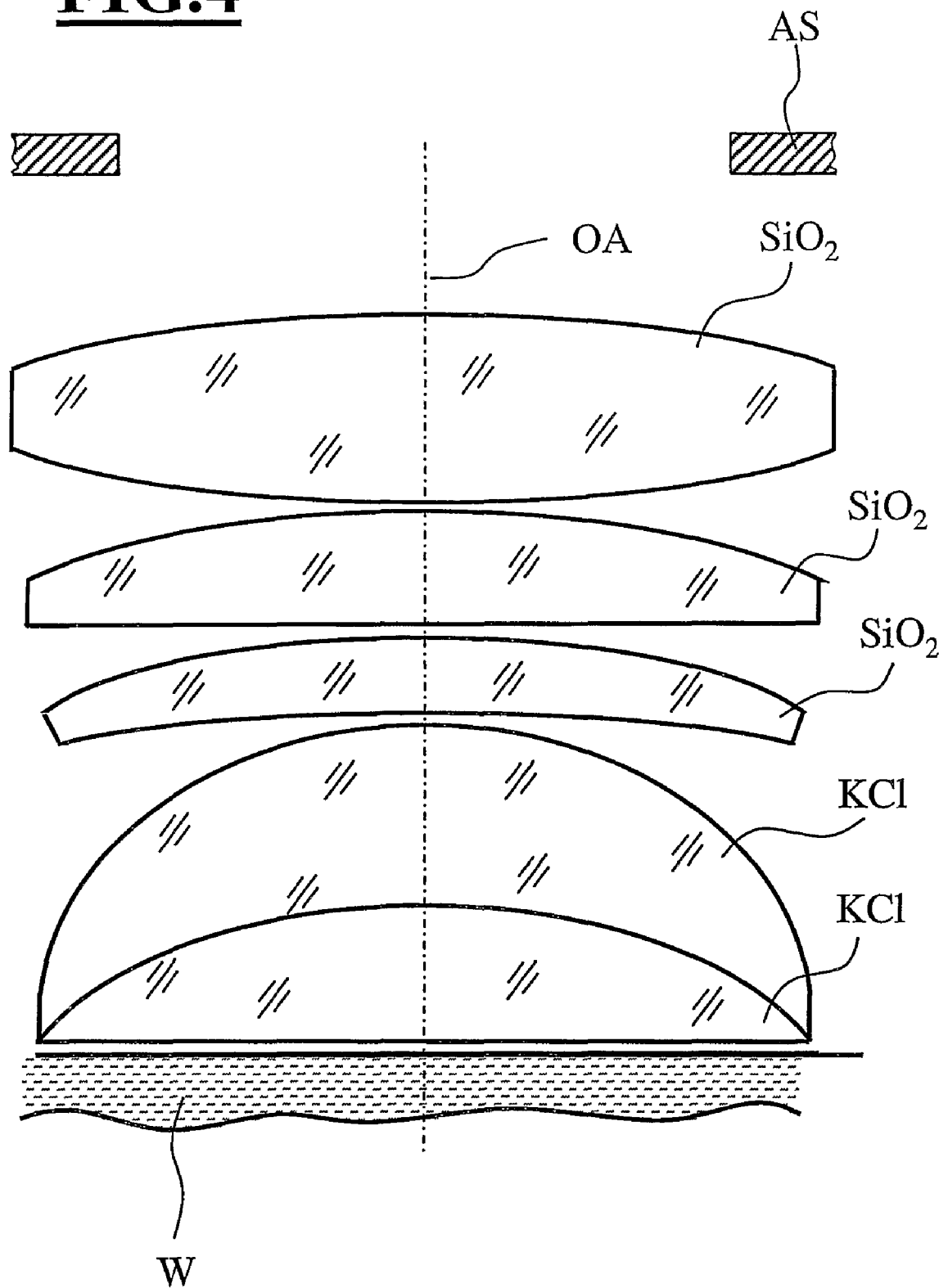

FIG. 4 schematically illustrates the part of a projection objective that extends from the aperture stop plane AS (system aperture plane or a conjugate plane of the system aperture plane) closest to the image field, equipped with KCl lenses according to the invention in near-field distance from a resist/wafer W.

Many applications, also at the 32 nm node, can be realized and manufactured more easily with $k_1$ factors not quite as small as mentioned above. A second optical material has been found which meets the requirements of isotropy and transmittance at 193 nm. In addition, the refractive index is even higher.

Sodium chloride NaCl has a refractive index of 1.829085 at a wavelength of 193 nm. As a result, the $k_1$-factor for 193 nm and for the 22 nm node can be raised again to 0.287, if one sets a maximum geometric incidence angle of 71.8°. However, with NaCl the absorption edge is slightly closer to 193 nm. Consequently, the contributions to the intrinsic birefringence are larger with NaCl than with KCl.

Therefore, special attention has to be paid to the compensation of the intrinsic birefringence. To compensate the intrinsic birefringence in the case of NaCl, it is proposed to join curved surfaces of NaCl lenses of different crystallographic orientation by wringing (see FIG. 4).

It is likewise proposed to perform a compensation by using two different materials. Among other possibilities, this also includes combinations such as NaCl/MgO and NaCl/$CaF_2$.

Figure 5:
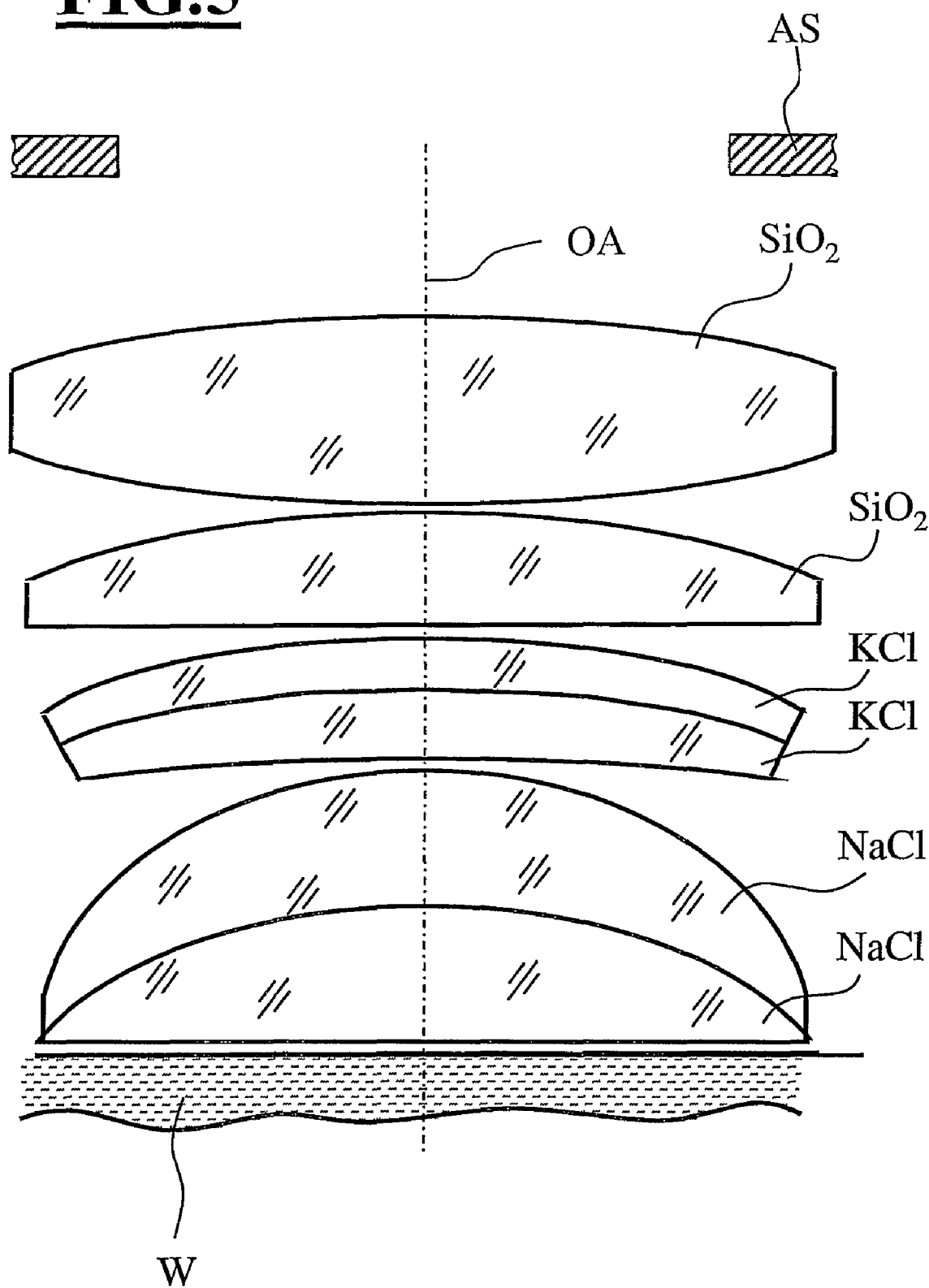

FIG. 5 shows an end group of a projection objective configured in this manner with a lens member made of two wrung-together KCl lens elements and as the closing member on the image side two wrung-together monocrystalline NaCl lens elements. The crystallographic orientations of the lens elements are in each case rotated relative to each other for the compensation of birefringence.

Figure 6:
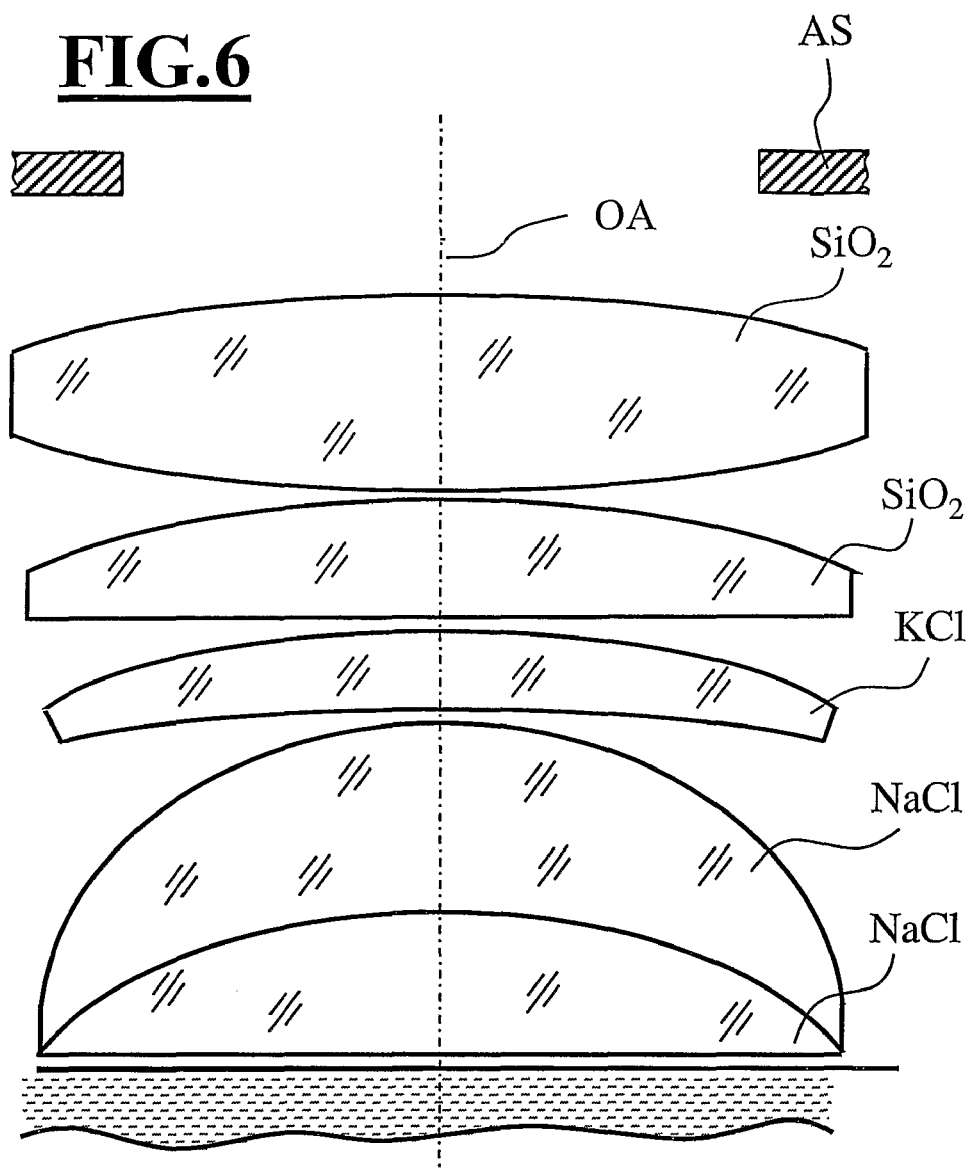
Figure 7:
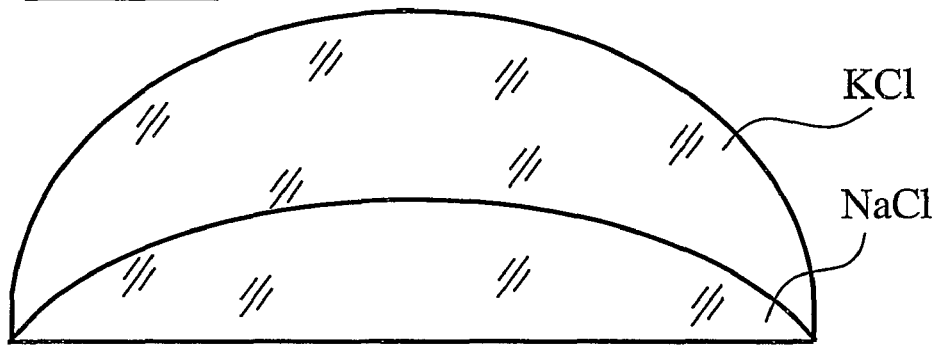

Another example is illustrated in FIG. 6, where an individual KCl crystal lens is arranged in combination with an NaCl lens member of two wrung-together elements.

The coefficient of expansion is $36.6 \cdot 10^{-6}$ $K^{-1}$ for KCl, and $39.8 \cdot 10^{-6}$ $K^{-1}$ for NaCl. It therefore makes sense and is feasible to join the two different materials by wringing. This is shown schematically in FIG. 7.

Because of its large index of refraction, NaCl should be used as the last optical element of positive refractive power. However, since larger amounts of intrinsic birefringence are present in this case, the KCl lens combines a greater refractive power with smaller intrinsic birefringence and favorable transmittance, so that the intrinsic birefringence can be compensated better and the heating of the last double lens can be kept smaller due to the reduced overall amount of absorption.

Consequently, the invention is also directed to the use of the proposed materials in 248 nm or 193 nm lithography applications; to the use of the optical near field or immersion simultaneously with the proposed materials; to the compensation of the intrinsic birefringence in NaCl at 193 nm; to the compensation of the intrinsic birefringence associated with KCl lenses; to mixed combinations in which KCl and NaCl lens elements are wrung together; to refractive indices larger than 1.75 or larger than 1.82 in lenses; to the use of chlorine compounds as a crystal material for the wavelength of 193 nm; to the location where the materials are used within the objective, i.e., after the aperture stop or after a conjugate location of the aperture stop and before the image plane; to an angle of incidence on the lens surface of at least 60° and preferably larger than 70° in lenses of the proposed materials; and to the use of p-polarized light in these materials.

The term "lens" as used herein refers to a refractive optical element of only one material, also often referred to as lens component.

Notwithstanding any of the concepts proposed herein, this optical element can still be coated, in particular with antireflex coatings and protective coatings against chemical and physical factors such as being attacked by aggressive chemicals, being dissolved by water or other solvents (moisture protection coating), or against scratching.

A further crystal material that has been found suitable for the lens elements of a lithography objective is YAG (yttrium aluminum granate). Its chemical formula is $Y_3Al_5O_{12}$.

As a result of the yttrium content in the crystal molecules, the refractive index of YAG is higher than in MgO. In particular for 248 nm, YAG has a good transmittance. As YAG has been used for many years as a material to grow high-quality crystals for lasers, and with the need to continuously improve these lasers, YAG has in the meantime been developed much farther than for example MgO or spinel $MgAl_2O_4$.

Besides spinel with an absorption edge at 160 nm and MgO with an absorption edge at 165 nm, YAG is another material that is still sufficiently transmissive at 193 nm.

Based on the higher index of refraction one can estimate that an absorption edge in YAG lies at about 175 nm. This makes YAG suitable as a material for lithographic projection systems for wavelengths of 248 nm and 193 nm. YAG is basically isotropic but exhibits intrinsic birefringence at 248 nm and in particular at 193 nm, as is also known to occur in $CaF_2$ and has been described above for chloride crystals. To compensate this birefringence, it is proposed on the one hand to place at least 2 YAG-lenses close up to the wafer or on the other hand to use a combination of YAG with MgO, or YAG with spinel, or all of the three kinds of crystals.

Figure 8:
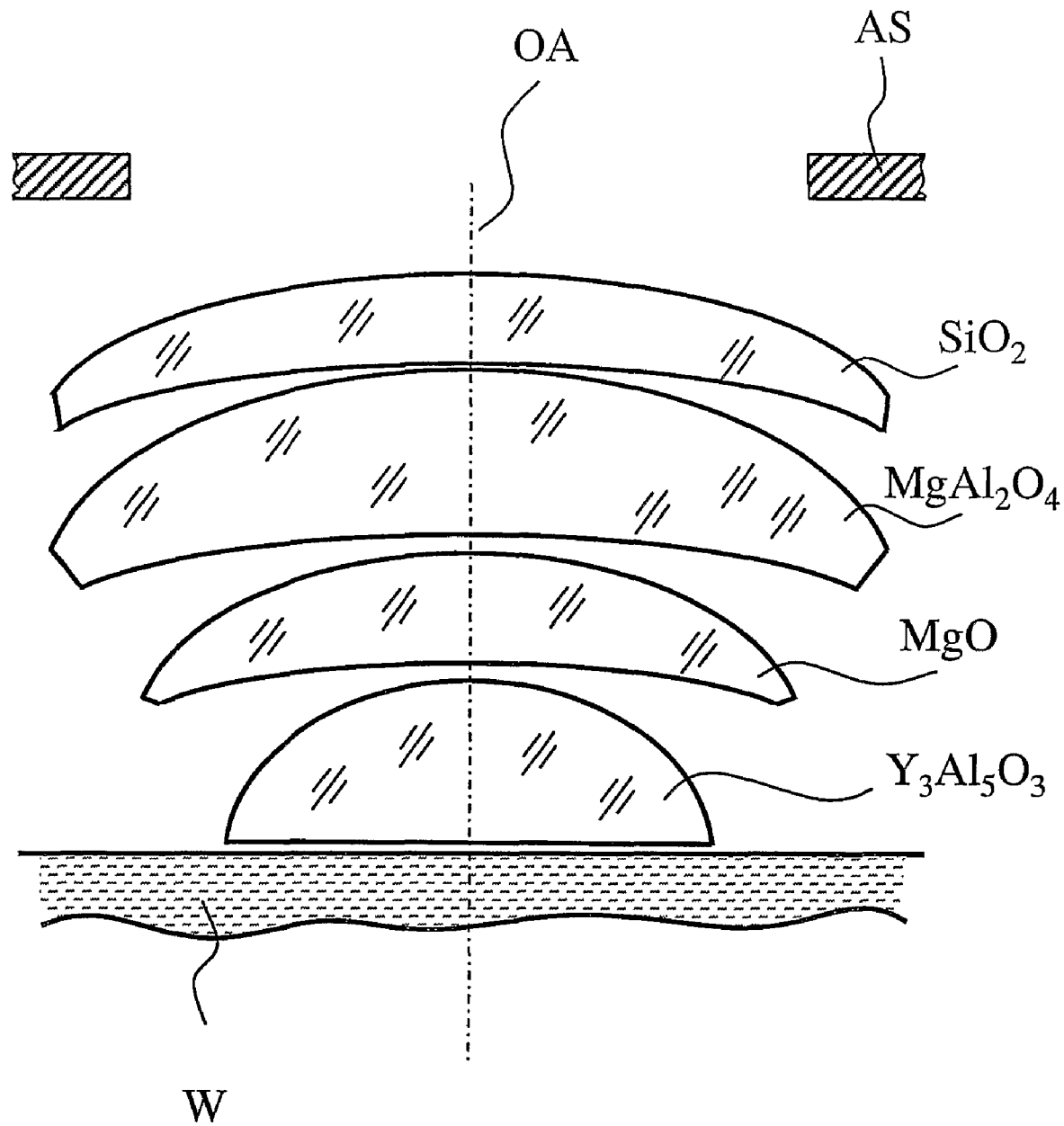

FIG. 8 illustrates the foregoing concept schematically in an example.

The invention claimed is:

1. Microlithography projection objective comprising a numerical aperture on the image side equal to or larger than 1.0, containing at least one lens of a crystal material from the group that consisting of NaCl, KCl, KI, NaI, RbI, CsI, MgO, $MgAl_2O_4$ and $Y_3Al_5O_{12}$.

2. Microlithography projection objective according to claim 1, characterized in that the last curved lens on the image side comprises one of the crystal materials named.

3. Microlithography projection objective according to claim 1 or claim 2, wherein the numerical aperture on the image side is more than 1.40.

4. Microlithography projection objective according to claim 1 or claim 2, wherein at least one lens of one of the named crystal materials has a moisture protection coating.

5. Microlithography projection objective according to claim 1 or claim 2, wherein a plurality of lenses comprise one of the crystal materials, and that the index of refraction at an operating wavelength is highest for the lens that is arranged nearest to an image plane of the projection objective.

6. Microlithography projection objective according to claim 1 or claim 2, wherein the objective is configured as an immersion objective.

7. Microlithography projection objective according to claim 1 or claim 2, wherein the objective is configured as an optical-near-field objective.

8. Microlithography projection objective according to claim 1 or claim 2, wherein the objective has an operating wavelength from the group consisting of 248 nm, 193 nm and 157 nm.

9. Microlithography projection objective according to claim 1 or claim 2, wherein at least one of the lenses of one of the crystal materials named is composed of at least two lens components that are oriented with different crystallographic orientations.

10. Microlithography projection objective according to claim 1 or claim 2, wherein at least one lens is composed of a plurality of components and that at least one of said components consists of a crystal material.

11. Microlithography projection objective according to claim 1 or claim 2, wherein the numerical aperture on the image side is more than 1.65.

12. Microlithography projection objective according to claim 1 or claim 2, wherein the numerical aperture on the image side is more than 2.0.

13. Microlithography projection objective according to claim 1 or claim 2, wherein said plurality of lenses comprise different ones of the crystal materials named.

14. Microlithography projection objective having a plurality of lenses comprising one of the crystal material from the group that consisting of NaCl, KCl, KI, NaI, RbI, CsI, MgO, $MgAl_2O_4$ and $Y_3Al_5O_{12}$, wherein the index of refraction at an operating wavelength is highest for the lens that is arranged nearest to an image plane of the projection objective.

* * * * *